(12) United States Patent
Yu et al.

(10) Patent No.: US 10,486,192 B2
(45) Date of Patent: Nov. 26, 2019

(54) METHOD OF FABRICATING PATTERNED CRYSTAL STRUCTURES

(71) Applicant: King Abdullah University of Science and Technology, Thuwal (SA)

(72) Inventors: Liyang Yu, Thuwal (SA); Aram Amassian, Thuwal (SA)

(73) Assignee: KING ABDULLAH UNIVERSITY OF SCIENCE AND TECHNOLOGY, Thuwal (SA)

(*) Notice: Subject to any disclaimer, the term of this patent is extended or adjusted under 35 U.S.C. 154(b) by 0 days.

(21) Appl. No.: 15/580,529

(22) PCT Filed: Jun. 10, 2016

(86) PCT No.: PCT/IB2016/053443
§ 371 (c)(1),
(2) Date: Dec. 7, 2017

(87) PCT Pub. No.: WO2016/199093
PCT Pub. Date: Dec. 15, 2016

(65) Prior Publication Data
US 2018/0133752 A1 May 17, 2018

Related U.S. Application Data

(60) Provisional application No. 62/175,701, filed on Jun. 15, 2015, provisional application No. 62/173,757, filed on Jun. 10, 2015.

(51) Int. Cl.
B05D 3/00 (2006.01)
H01L 21/02 (2006.01)
(Continued)

(52) U.S. Cl.
CPC ............. B05D 3/007 (2013.01); B05D 1/60 (2013.01); B05D 3/0254 (2013.01);
(Continued)

(58) Field of Classification Search
CPC combination set(s) only.
See application file for complete search history.

(56) References Cited

U.S. PATENT DOCUMENTS 4,897,150 A * 1/1990 Dooley ............. H01L 21/32051
219/121.85
5,606,179 A * 2/1997 Yamazaki ........... H01L 21/2022
257/59
(Continued)

OTHER PUBLICATIONS

"Nanoscale Control of Polymer Crystallization by Nanoimprint Lithography", Zhijun Hu, Gabriel Baralia, Vincent Bayot, Jean-François Gohy, and Alain M. Jonas, Nano Lett., 2005, 5 (9), pp. 1738-1743.*
(Continued)

Primary Examiner — David P Turocy
Assistant Examiner — Mohammad Mayy
(74) Attorney, Agent, or Firm — Billion & Armitage; Michael A. Collins

(57) ABSTRACT

A method of manufacturing a patterned crystal structure for includes depositing an amorphous material. The amorphous material is modified such that a first portion of the amorphous thin-film layer has a first height/volume and a second portion of the amorphous thin-film layer has a second height/volume greater than the first portion. The amorphous material is annealed to induce crystallization, wherein crystallization is induced in the second portion first due to the greater height/volume of the second portion relative to the first portion to form patterned crystal structures.

16 Claims, 14 Drawing Sheets

(51) Int. Cl.
*H01L 51/00* (2006.01)
*B05D 1/00* (2006.01)
*B05D 3/02* (2006.01)
*H01L 51/05* (2006.01)

(52) U.S. Cl.
CPC .. *H01L 21/02554* (2013.01); *H01L 21/02667* (2013.01); *H01L 51/0014* (2013.01); *H01L 51/0026* (2013.01); *H01L 51/0558* (2013.01); *H01L 2251/105* (2013.01)

(56) References Cited

U.S. PATENT DOCUMENTS

2013/0295714 A1* 11/2013 Naseem ............... H01L 31/20
438/96
2014/0312335 A1 10/2014 Goto et al.

OTHER PUBLICATIONS

Meyer, et al., "Film formation of crystallizable polymeres on microheterogeneous surfaces", Journal of Physics: condensed matter, Institute of physics Publishing, Bristol, GB, vol. 17, No. 9, Mar. 9, 2005, S623-S635.
Reiter, "Model experiments for a molecular understanding of polymer crystallization", Journal of Polymer Science Part B: Polymer Physics, vol. 41, No. 16, Aug. 15, 2003, 1869-1877.
Three Bond, "Ultraviolet-ozone surface treatment", Three Bond Technical News, vol. 17,, Mar. 20, 1987, 1-10.
Search Report and Written Opinion for PCT/IB2016/053443 dated Sep. 12, 2016.

* cited by examiner

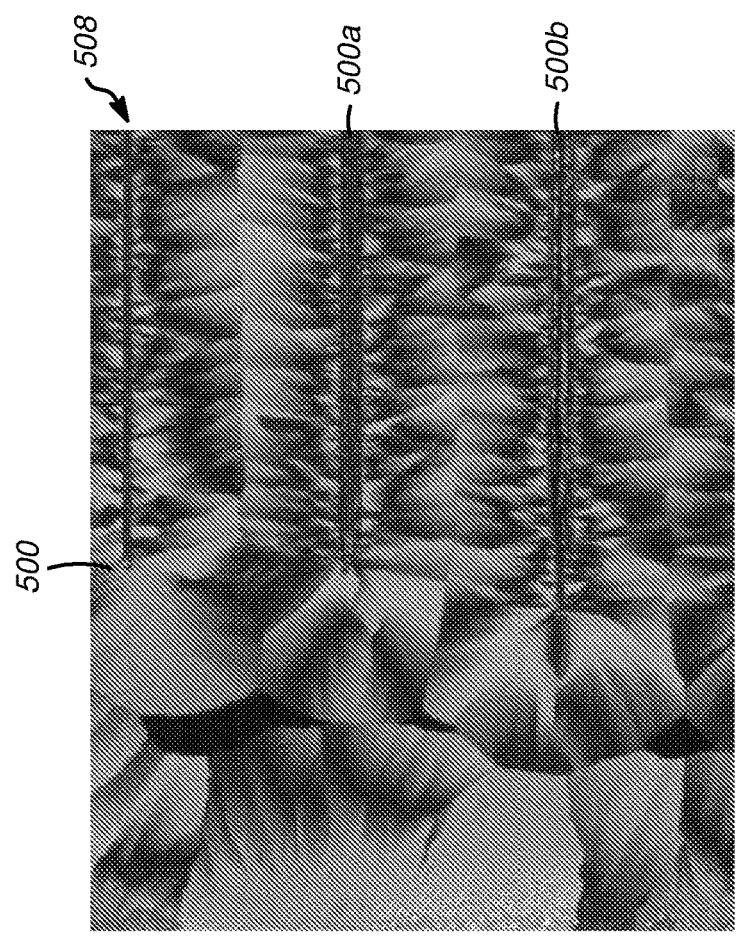
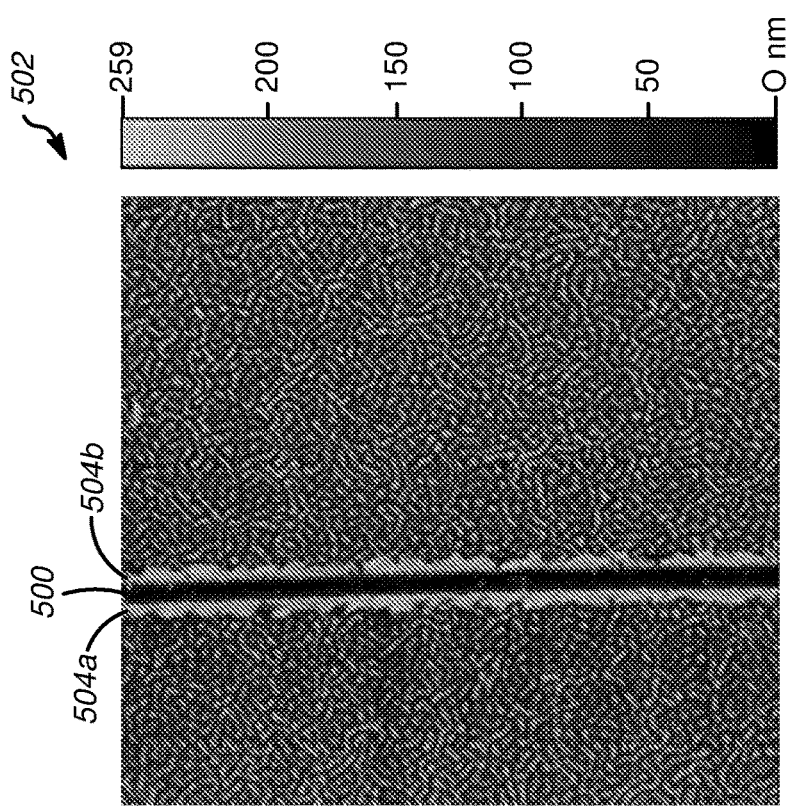
FIG. 5B
FIG. 5A

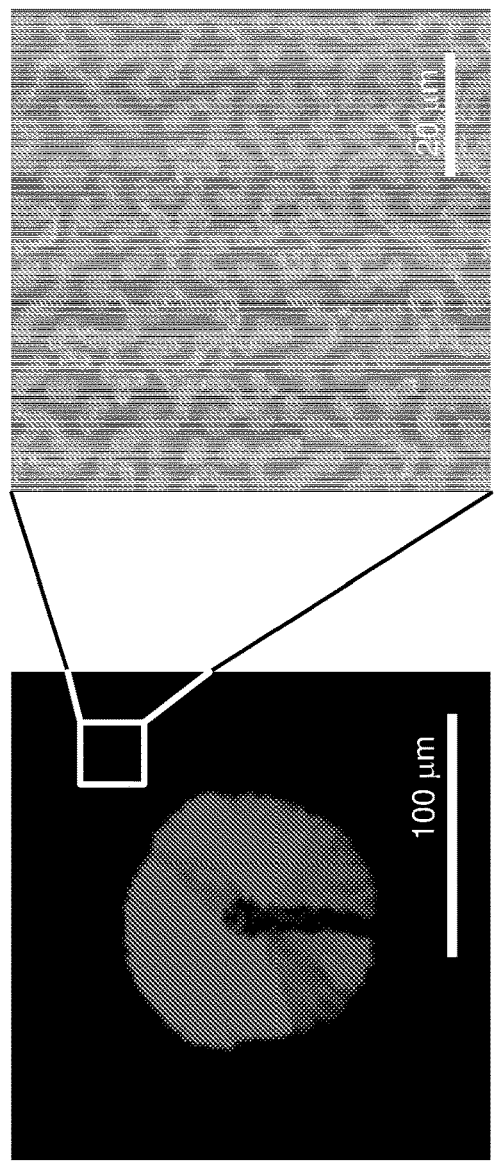
FIG. 8C
FIG. 8B
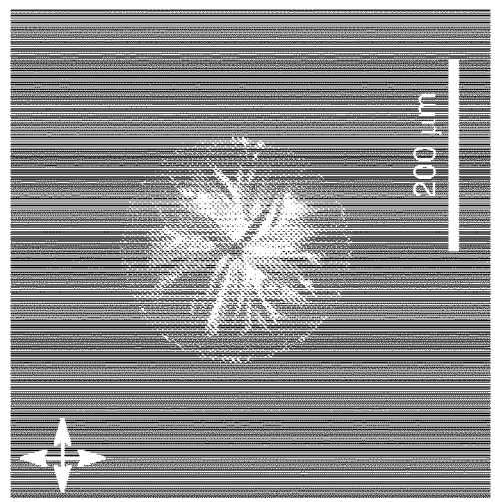
(PRIOR ART)
FIG. 8A

METHOD OF FABRICATING PATTERNED CRYSTAL STRUCTURES

CROSS-REFERENCE TO RELATED APPLICATIONS

This application claims priority to U.S. Provisional Application No. 62/173,757, filed Jun. 10, 2015 and to U.S. Provisional Application No. 62/175,701, filed Jun. 15, 2015, which applications are incorporated herein by reference.

TECHNICAL FIELD

The present disclosure is related generally to fabrication of crystal structures, and in particular to fabrication of patterned crystal thin-film and/or 3D structures.

BACKGROUND

The mechanical, optical, and electrical properties of materials depend in large part on the crystallized structure of the material. Therefore, the ability to manipulate and control the crystal structure of materials has wide applications. One of these applications is the fabrication of organic semiconductors.

In contrast with typical inorganic semiconductor fabrication techniques, organic semiconductors are constructed via deposition of amorphous thin-film materials. Fabrication techniques may include soluble, conjugated polymers prepared via solution processing methods or—if insoluble—then deposited via vacuum sublimation. Common examples of solvent-based coating techniques include drop casting, spin-coating, doctor-blading, inkjet printing and screen printing. Vacuum based thermal deposition of small molecules requires evaporation of molecules from a hot source. The molecules are then transported through vacuum onto a substrate. Condensation of these molecules on the substrate surface results in thin film formation. Regardless of technique, the organic material deposited onto the silicon substrate is typically referred to as a thin-film layer. Subsequent processing of the thin-film layer may include an annealing step in order to promote crystal growth in the thin-film layer, thereby increasing the carrier mobility of the device.

In particular, carrier mobility is one of the most important factors in determining the performance of organic devices. However, current fabrication techniques oftentimes provide wide ranges of carrier mobilities. It would be desirable to develop fabrication techniques that not only would increase carrier mobility of organic semiconductor devices but that also would improve the predictability of organic semiconductor devices.

A number of other applications may benefit from the ability to control the patterning and crystallization of materials deposited in a disordered state, whether those materials are deposited as thin-film materials or larger, three-dimensional materials.

SUMMARY OF THE INVENTION

The present invention is directed to a method of manufacturing a device that includes a patterned crystallized structure. The method includes depositing an amorphous material. The amorphous material is modified such that a first portion of the amorphous thin-film layer has a first height/volume and a second portion of the amorphous thin-film layer has a second height/volume greater than the first portion. The amorphous material is annealed to induce crystallization, wherein crystallization is induced in the second portion first due to the greater height/volume of the second portion relative to the first portion to form patterned crystal structures.

BRIEF DESCRIPTION OF THE DRAWINGS

FIG. 5A is an atomic force micrograph view of a scratch made in an amorphous thin-film layer according to an embodiment of the present invention.

FIG. 5B is a polarized optical micrograph of the deposited thin-film layer with parallel scratches after annealing that illustrates crystallization of thicker portions of the amorphous thin-film layer according to an embodiment of the present invention.

FIG. 8A is a polarized optical microscopy view of an ink-jet printed thin-film deposited according to known methods.

FIG. 8B is a polarized optical microscopy view of a thin-film layer stamped and annealed to form a crystal thin-film structure according to an embodiment of the present invention.

FIG. 8C is a bright field optical microcopy view of a portion of the magnified view shown in FIG. 7B that illustrates isolated islands within the dewetted structure of the thin-film according to an embodiment of the present invention.

DETAILED DESCRIPTION

The present invention provides a method of fabricating patterned crystal structures. In particular, the present invention takes advantage of the inverse relationship between volume of an amorphous material and nucleation starting time, which determines which portion of the amorphous material is first to crystallize, to create a patterned crystallized structure. In amorphous thin-film materials, this inverse relationship is defined with respect to the thickness of the amorphous thin-film layer. By modifying the thickness of the amorphous thin-film layer, crystallization of the amorphous thin-film layer can be selectively controlled and utilized to generate a patterned crystal thin-film structure. For the sake of simplicity, the present invention is described with respect to thin-film devices, but it should be understood that the concepts described with respect to thin-films may be applied to three-dimensional devices defined by volumes rather than thicknesses.

Figure 1:
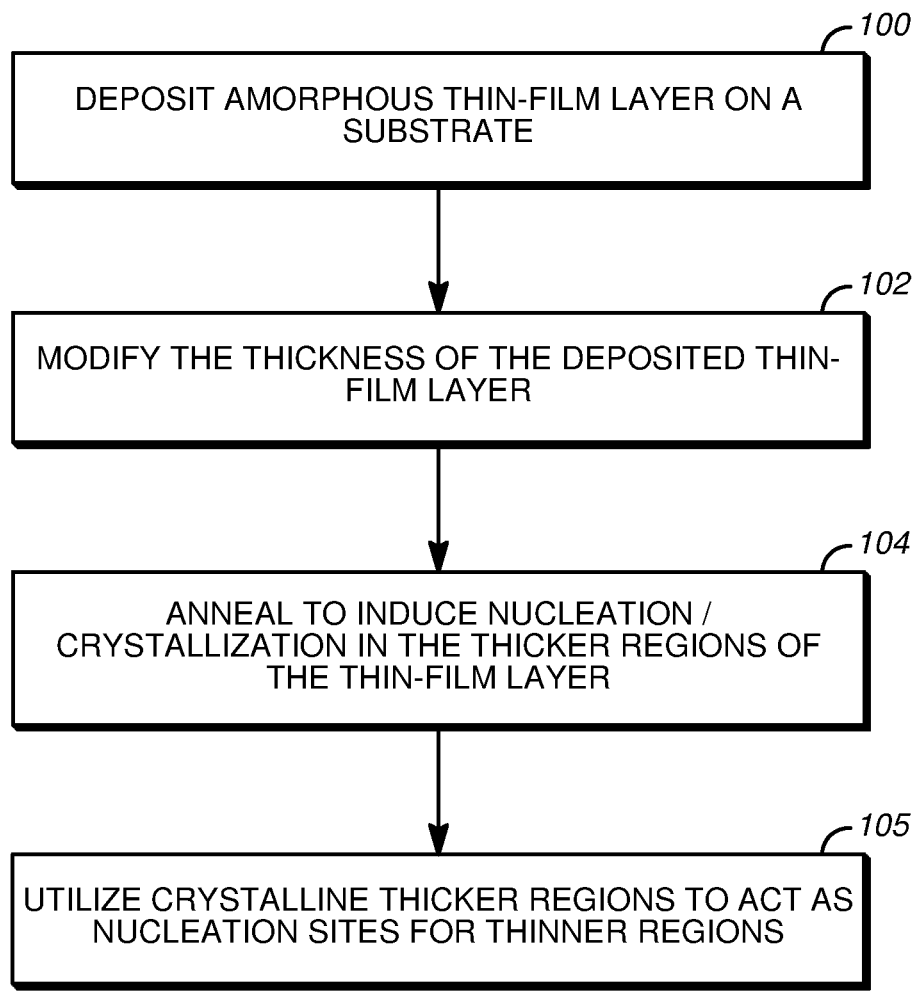
FIG. 1 is a flowchart that illustrates a method of fabricating a patterned crystal thin-film structure according to an embodiment of the present invention.

FIG. 1 is a flowchart that illustrates a method of fabricating a patterned crystal thin-film structure according to an embodiment of the present invention. At step 100, an amorphous thin-film layer is deposited on a substrate. The term "amorphous" refers to the lack of crystalline structure within the thin-film layer. During an annealing process, portions of the amorphous thin-film layer are nucleated and then crystallized to modify the properties (e.g., mechanical, optical, electrical, etc.) of the material, such as to increase the charge carrier mobility within a semiconductor thin-film. A variety of well-known deposition processes may be employed to deposit the amorphous thin-film layer onto the substrate (e.g., solution based deposition, vapor based vacuum deposition, etc). However, at this point in the process, it is important that the thin-film layer remain in an amorphous state (i.e., not be allowed to crystallize). The deposition process may therefore take advantage of processes to prevent crystallization of the thin-film layer, such as deposition at low temperature or heating the thin-film to a temperature above its melting temperature, or including a residue solvent to prevent crystallization of the thin-film. In other embodiments, a fast vacuum or solution process are utilized to deposit a kinetically quenched thin-film layer.

At step 102, a thickness of the deposited thin-film layer is modified in select locations such that some areas of the deposited thin-film layer are thicker than others. A plurality of different processes may be utilized to modify the thickness of the thin-film layer. For example, in one embodiment (described in more detail with respect to FIGS. 3A-3C), a two-step deposition process is utilized in which an initial amorphous thin-film layer is deposited on the substrate and then subsequently a mask is utilized to selectively deposit a second amorphous thin-film layer at select locations. As a result, the amorphous thin-film layer is thicker at those select locations where the second amorphous thin-film layer is deposited. In other embodiments, the thickness of the thin-film layer is modified by mechanically altering the amorphous thin-film layer. That is, by physically contacting the amorphous thin-film layer, the thin-film layer is removed from the point or line of contact and pushed away forming thicker areas adjacent to the point contacted. As described with respect to FIGS. 4A-4C, mechanical modification of the thickness of the amorphous thin-film layer may include scratching the surface of the thin-film layer with a tool and/or stamping the thin-film layer to create a linear or circular region wherein the thin-film layer is thicker than normal. With either of these techniques, unique patterns can be generated in the amorphous thin-film layer of thicker and thinner portions.

At step 104, crystallization is a process that involves two distinguishable steps, nucleation and crystal growth. Nucleation time refers to the average expected amount of time required for the formation of a stable cluster of the targeted crystalline phase of material within the amorphous thin-film layer. The nucleation time is shorter for thicker areas, hence, the thicker area can be fully crystallized before nucleation begins in the thinner areas. In step 105, crystal growth in the thinner area occurs subsequently, taking the crystals nucleated in the thicker region as a seed, hence defining the position of the crystal structure within thinner areas.

Figure 2:
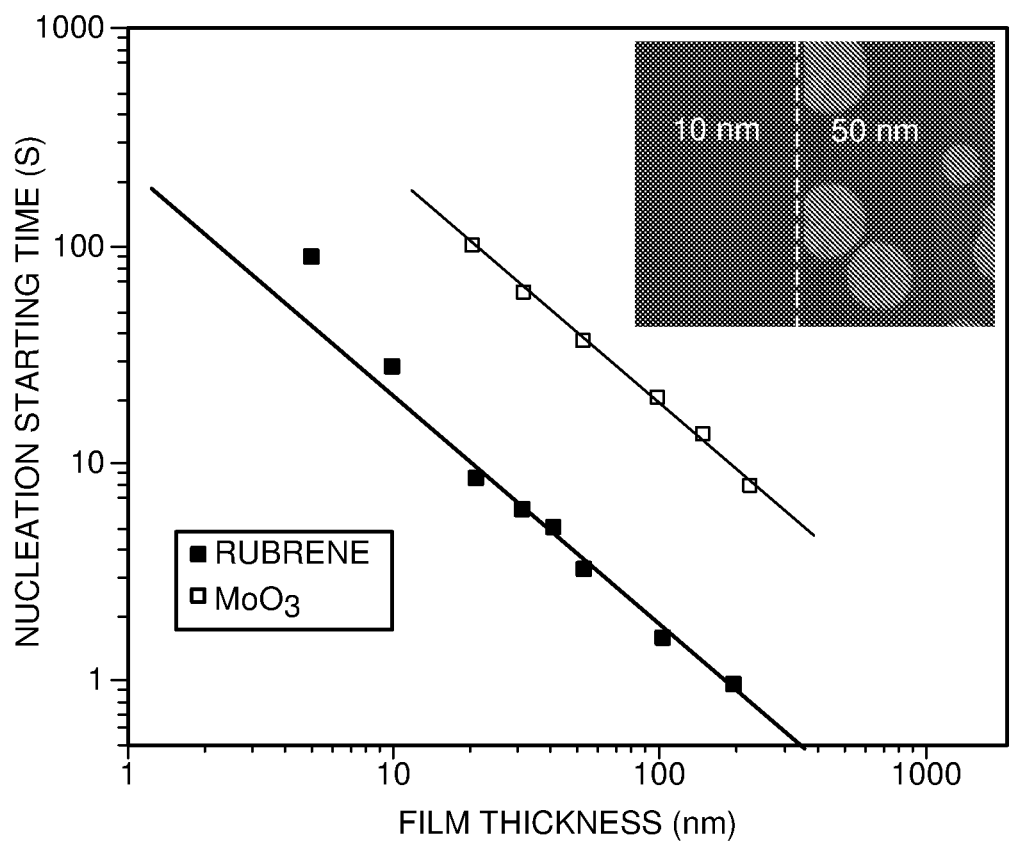
FIG. 2 is a plot illustrating the relationship between thin-film thickness and nucleation starting times of various materials as observed in experiments designed according to an embodiment of the present invention.

As described in more detail with respect to FIG. 2, nucleation starting time for identical material and environmental conditions is inversely proportional to the thickness of the amorphous thin-film layer. Thus, nucleation is likely to occur in the thicker regions of the amorphous thin-film layer, with crystallization forming next in these regions and extending outward from these regions—if desired.

The result of these steps is a patterned crystal thin-film structure, wherein the pattern is designed via the selective modification of the height/thickness of the amorphous thin-film layer. When utilized in organic semiconductor devices, the patterned crystal thin-film structure provides increased overall performance of devices and can benefit circuits due to reduced device performance spread and cross talking between devices.

FIG. 2 is a plot illustrating the relationship between thin-film thickness and nucleation starting times of various materials as observed in experiments designed according to an embodiment of the present invention. In the embodiment shown in FIG. 2, an organic small molecule (e.g., 5, 6, 11, 12-tetraphenylnaphthacene; rubrene) was tested against an inorganic metal oxide material (e.g., molybdenum trioxide; $MoO_3$). The x-axis of the graph illustrates various thicknesses of material tested expressed in units of nanometers. The y-axis illustrates nucleation starting time expressed in units of seconds. Both the x-axis and y-axis are displayed as logarithmic axes, such that the plot shown in FIG. 2 is a double-logarithm plot.

FIG. 2 illustrates with respect to the organic small molecule thin-film layer, as the thickness of the film increases the nucleation starting time decreases. Similarly, the same relationship is observed with respect to the inorganic metal oxide thin-film layer, wherein as the thickness of the film increases the nucleation starting time decreases. This observation can be described mathematically by the equation:

$$t \equiv \frac{1}{R*A*d} \propto d^{-1}$$

wherein t is time, R is the nucleation rate, A is the area of the thin film, and d is the thickness of the thin-film. The dimension of the area A is significantly larger than the thickness d and can therefore be considered a large constant in the context of thin film crystallization patterning. The nucleation rate is expected to be unchanged as identical material and crystallization procedures are adopted. As indicated, the average time to nucleation t is inversely proportional to the thickness d of the thin-film. This relationship also holds true for thin films of constant or variable thickness pre-sculpted or patterned before crystallization and where the volume is controlled by changing the area of the pattern in addition to thickness, and hence the area of the amorphous material predominantly dictates the time for nucleation, according to the following equation:

$$t \equiv \frac{1}{R*A*d} \propto A^{-1}$$

This relationship can be applied to shapes other than thin-films, such as three-dimensional shapes where volume of the amorphous material dictates the time for nucleation, according to the following equation:

$$t \equiv \frac{1}{R*V} \propto V^{-1}$$

Figure 3A:
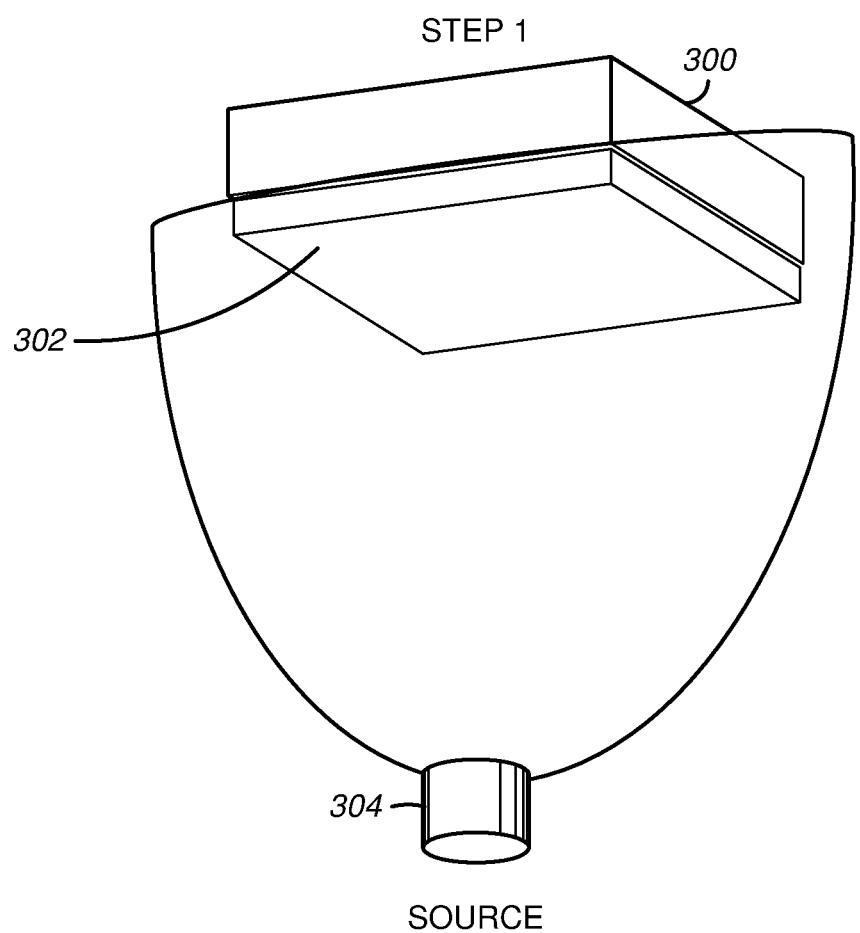
FIGS. 3A and 3B are schematic diagrams illustrating a deposition of amorphous thin-film layers to create an amorphous thin-film layer having portions with different thicknesses according to an embodiment of the present invention.
Figure 3B:
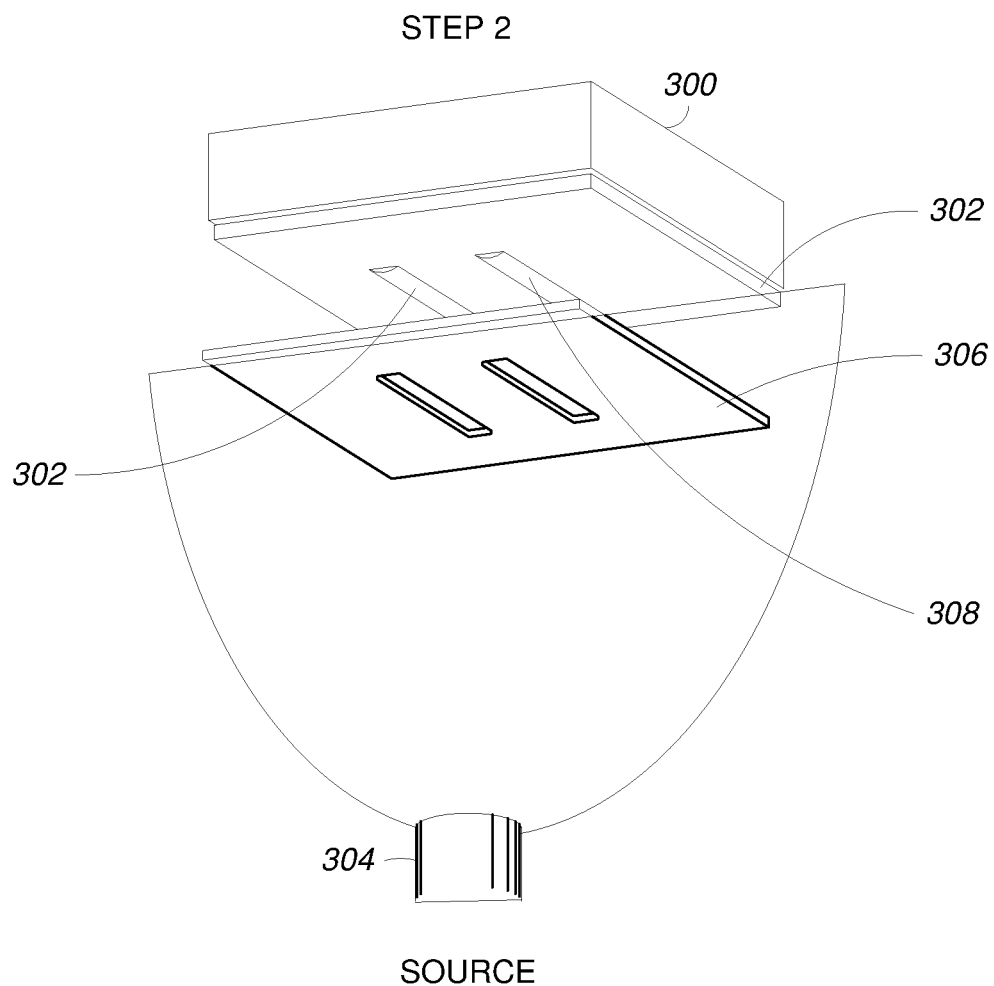

FIGS. 3A and 3B are schematic diagrams illustrating a deposition of amorphous thin-film layers to create an amorphous thin-film layer having portions with different thicknesses according to an embodiment of the present.

In the embodiment shown in FIGS. 3A-3B, a two-step deposition process is utilized to create the desired thickness of amorphous thin-film layers on substrate 300. In the first step shown in FIG. 3A, an amorphous thin-film layer 302 is deposited evenly on a surface of substrate 300 by deposition source 304. As discussed above, a variety of deposition processes may be utilized to evenly deposit an amorphous thin-film layer onto substrate 300, such as solution processing and/or vacuum-based deposition. In the second step, shown in FIG. 3B, masking layer 306 is utilized to selectively deposit another amorphous thin-film layer 308 on the surface of amorphous thin-film layer 302, effectively increasing the thickness of the amorphous thin-film layer 302 at these locations. For example, in the embodiment shown in FIG. 3B, the deposition of the second amorphous thin-film layer 308 is utilized to create two parallel lines where the amorphous thin-film layer is thicker than surrounding areas.

In other embodiments, masking layer 306 may utilize various geometries in order to generate desired patterns of thicker layers in the amorphous thin-film layer, such as a dot array of thicker regions or a grid-like array of thicker lines. In addition, although a two-step deposition process was illustrated in FIGS. 3A-3B, in other embodiments additional masking/deposition steps may be utilized to create the desired pattern of thicker regions in the deposited amorphous thin-film layer.

Figure 3C:
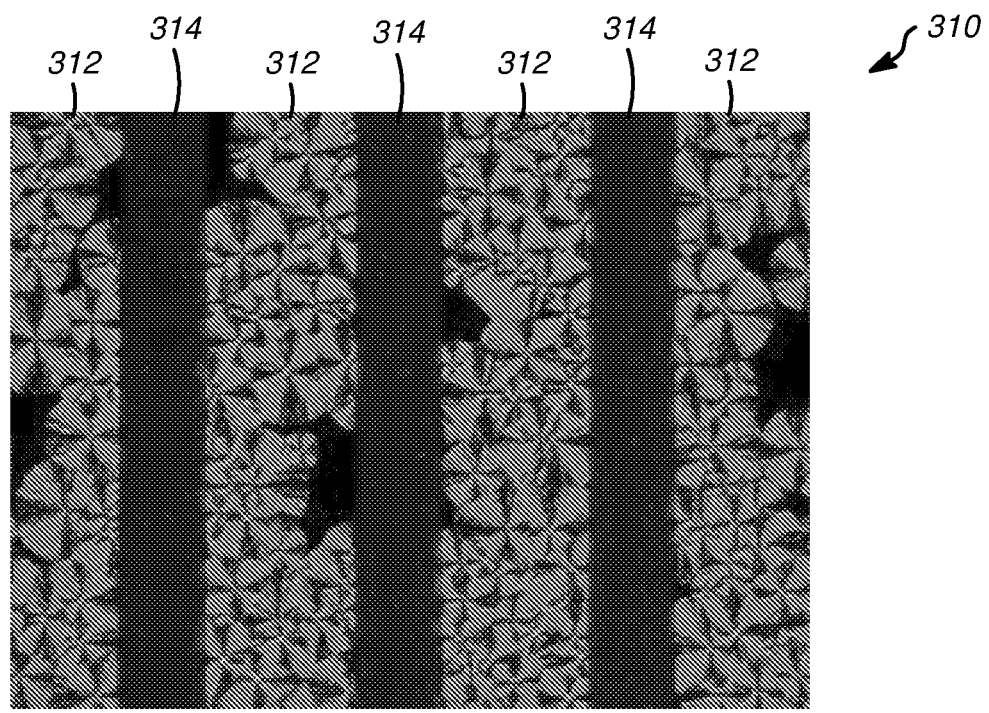
FIG. 3C is a polarized optical microscopy view of the deposited thin-film layer after annealing that illustrates crystallization of thicker portions of the amorphous thin-film layer according to an embodiment of the present invention.

FIG. 3C is a polarized optical microscopy view of the deposited thin-film layer after annealing that illustrates crystallization of thicker portions 312 of the amorphous thin-film layer 310 according to an embodiment of the present invention. Nucleation and crystallization is induced via an annealing process. As described with respect to FIG. 2, nucleation is induced more quickly in thicker regions of the amorphous thin-film, which results in these regions crystallizing prior to the thinner regions. If desired, crystallized thin-film regions 312 may be utilized as nucleation seeds for subsequent crystal growth in the amorphous thin-film regions 314. Alternatively, these thinner regions may be left in an amorphous state.

Figure 4C:
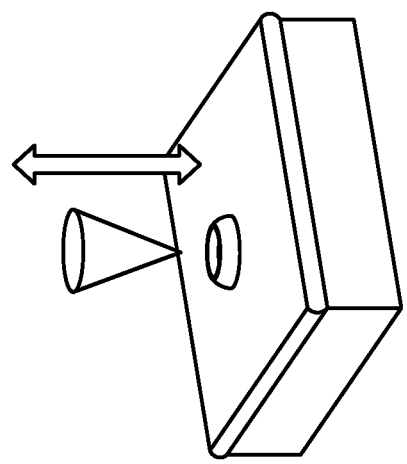
FIGS. 4A-4C are schematic diagrams illustrating mechanical deformation of a deposited thin-film layer to create areas of different thicknesses according to various embodiments of the present invention.
Figure 4B:
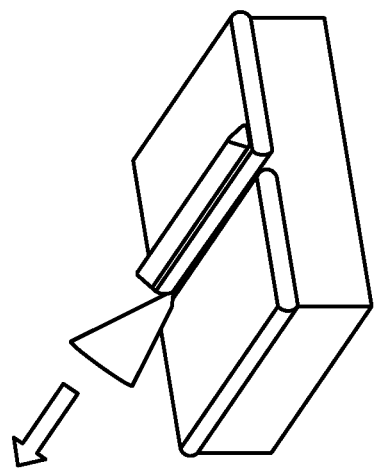
Figure 4A:
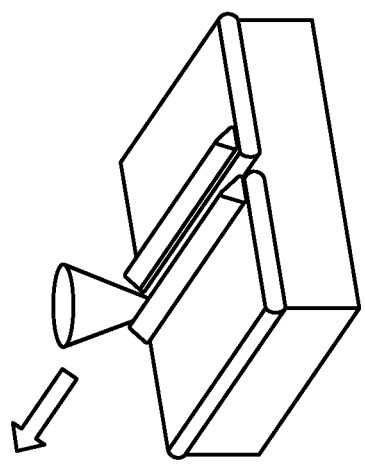

FIGS. 4A-4C are schematic diagrams illustrating mechanical deformation of a deposited thin-film layer to create areas of different thicknesses according to various embodiments of the present invention. Each of the embodiments illustrates an amorphous thin-film layer 400 deposited on a substrate 402. An external tool or device 404 is utilized to scratch or stamp the surface of the amorphous thin-film layer 400. The various embodiments illustrate how tool/device 404 may be utilized in various ways to generate different patterns of thicker/thinner regions in amorphous thin-film layer 400.

For example, in the embodiment shown in FIG. 4A, tool/device 404 is oriented in an upright or vertical direction and drawn along the surface of amorphous thin-film layer 400. The resulting mechanical deformation of amorphous thin-film layer 400 results in thicker regions 406 being formed on either side of the region scratched by tool/device 404. Adjacent to the thicker regions 406, amorphous thin-film layer 400 remains thinner than regions 406.

In the embodiment shown in FIG. 4B, tool/device 404 is oriented at an angle (e.g., 45 degrees) to amorphous thin-film layer 400, and drawn along the surface. The angle of tool/device 404 and direction in which the tool is pulled results in a thicker region 410 being created on one side of tool/device 404, as opposed to on both sides of tool/device 404 as shown in FIG. 4A.

In the embodiment shown in FIG. 4C, tool/device 404 is not drawn across the surface of amorphous thin-film layer 400, but rather is utilized to stamp amorphous thin-film layer 400. That is, tool/device is moved in a vertical direction (as indicated by the arrow) into amorphous thin-film layer 400, with the result being the creation of a thicker region 412 that is circular in shape. In other embodiments, various other tool/devices may be utilized to generate various geometries and thicknesses of amorphous thin-film layer 400. In addition, the embodiments utilized in FIGS. 4A-4C, as well as other embodiments, may be used in combination with one another to generate complex patterns within amorphous thin-film layer 400 of varying levels of thickness and shapes.

FIG. 5A is an atomic force micrograph of a scratch 500 made in an amorphous thin-film layer 502 according to an embodiment of the present invention. In particular, the embodiment shown in FIG. 5A illustrates the result of mechanically scratching an amorphous thin-film layer with a needle like device to create thick regions 504a and 504b on either side of the scratch 500, similar to that described with respect to FIG. 4A above. The embodiment shown in FIG. 5A utilizes 5.11-bis (triethylsilylethynyl) anthradithiophene (TES ADT) as the amorphous thin-film layer, which is an organic small molecule material and a p-type semiconductor.

FIG. 5B is a polarized optical micrograph of the deposited thin-film layer with parallel scratches 500a and 500b formed in amorphous thin-film layer 508 after annealing that illustrates crystallization of thicker portions (beside the scratches) of the amorphous thin-film layer nucleate the crystal growth in the thinner region according to an embodiment of the present invention. The embodiment shown in FIG. 5B utilizes TES ADT thin-film layer as described with respect to FIG. 5A, although other types of organic or inorganic thin-film layers may be utilized. In particular, parallel scratches 500a and 500b are formed to the right of dashed line 510 illustrated in FIG. 5B, leaving the left side of amorphous thin-film layer 508 of uniform thickness. As a result, during the annealing process, the thicker portions of the amorphous thin-film layer crystallize first. These crystals act as preferential nucleation sites for the surrounding thinner area, where nucleation is not favorable due to low thickness, forming structured, parallel crystals that extend away from parallel scratches 500*a* and 500*b*. In contrast, on the left-side of dashed line 510, in the area without any scratches or regions of different thickness, nucleation occurs randomly and in much lower density than that illustrated on the right side of dashed line 510. As a result, large stochastic spherulite crystals are formed in an unstructured manner.

FIGS. 6A-6F are optical micrograph views of scratched thin-film layers after an annealing process to crystallize thicker portions of the amorphous thin-film layer according to embodiments of the present invention. In particular, FIGS. 6A-6F illustrate the applicability of this method of fabrication for a variety of different materials and processing methods. For example, in the embodiment shown in FIG. 6A, the amorphous thin-filmed layer is comprised at least in part of rubrene, which is an organic small molecule, deposited by vapor deposition and scratched before thermal annealed at 150° C.

Figure 6C:
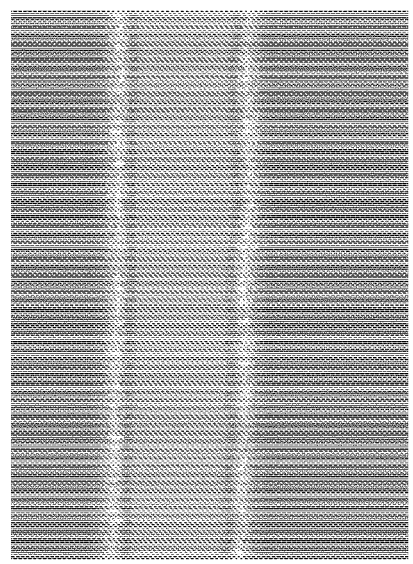
FIGS. 6A-6F are optical micrograph views of scratched thin-film layers after an annealing process to crystallize thicker portions of the amorphous thin-film layer according to embodiments of the present invention.
Figure 6B:
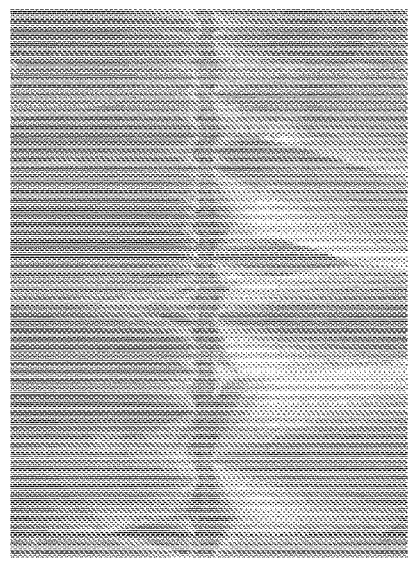
Figure 6A:

In the embodiment shown in FIG. 6B, the amorphous thin-filmed layer is comprised at least in part of poly (ethylene oxide) or PEO. The PEO amorphous thin-film layer fabricated by dropping a solution containing PEO and water onto a substrate, after forming a thin film, it is melted at a temperature of approximately 100° C., and then scratched while cooling.

In the embodiment shown in FIG. 6C, the amorphous thin-filmed layer is comprised at least in part of phenyl-$C_{61}$-butyric acid methyl ester (PCBM). This PCBM amorphous thin-filmed layer is an organic small molecule solution processed from chlorobenzene and scratched before thermal annealed at 260° C.

Figure 6F:
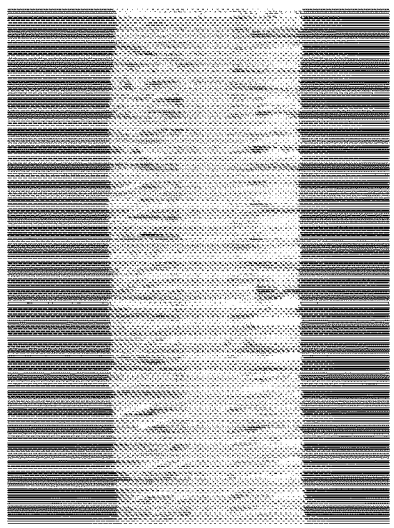
Figure 6E:
Figure 6D:
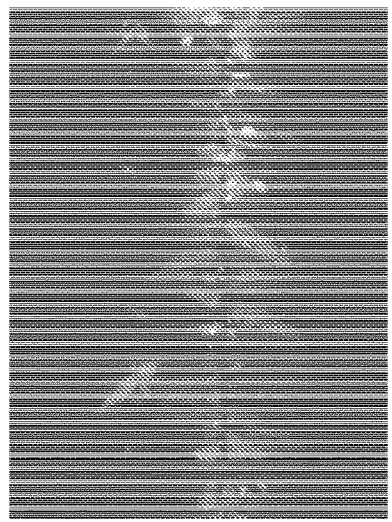

In the embodiment shown in FIG. 6D, the amorphous thin-filmed layer is comprised at least in part of zinc oxide (ZnO). The Zinc oxide amorphous thin-film layer is a metal oxide fabricated via a solution based sol-gel process and then scratched before thermal annealed at 400° C.

In the embodiment shown in FIG. 6E, the amorphous thin-filmed layer is comprised at least in part of Molybdenum trioxide ($MoO_3$). The $MoO_3$ amorphous thin-film layer is a metal oxide fabricated via an evaporation process and then scratched before thermal annealed at 230° C.

In the embodiment shown in FIG. 6F, the amorphous thin-filmed layer is comprised at least in part of methylammonium lead iodine perovskite ($CH_3NH_3PbI_3$). The amorphous film is obtained before the film fully dried from a dimethylformamide solution with 1:1 weight ratio Methylammonium Iodide and lead iodide solute and scratched while drying.

Figure 7A:
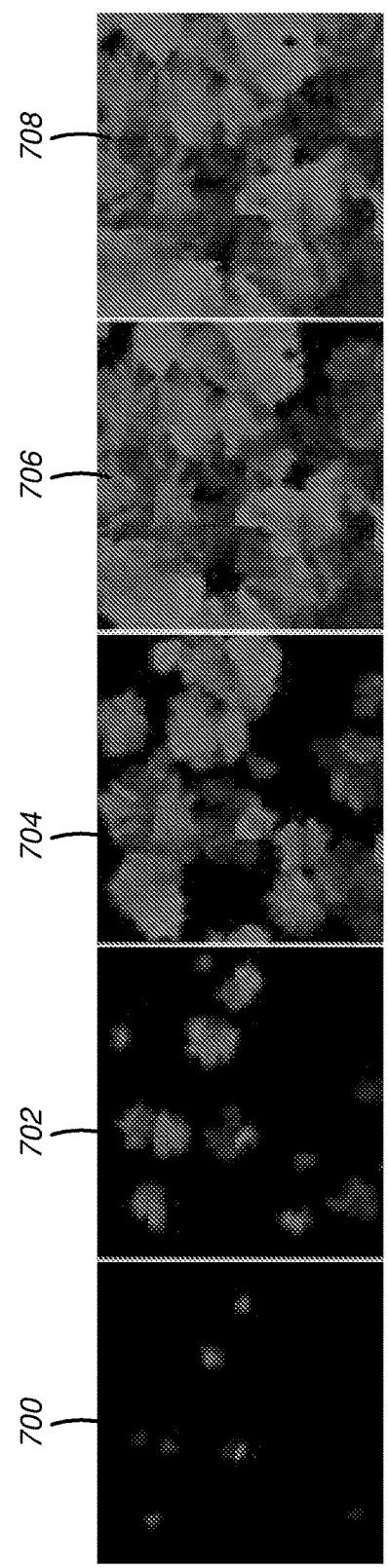
FIG. 7A illustrates magnified views of the crystallization of a thin-film layer during an annealing process without modification of the height of the deposited thin-film layer.
Figure 7B:
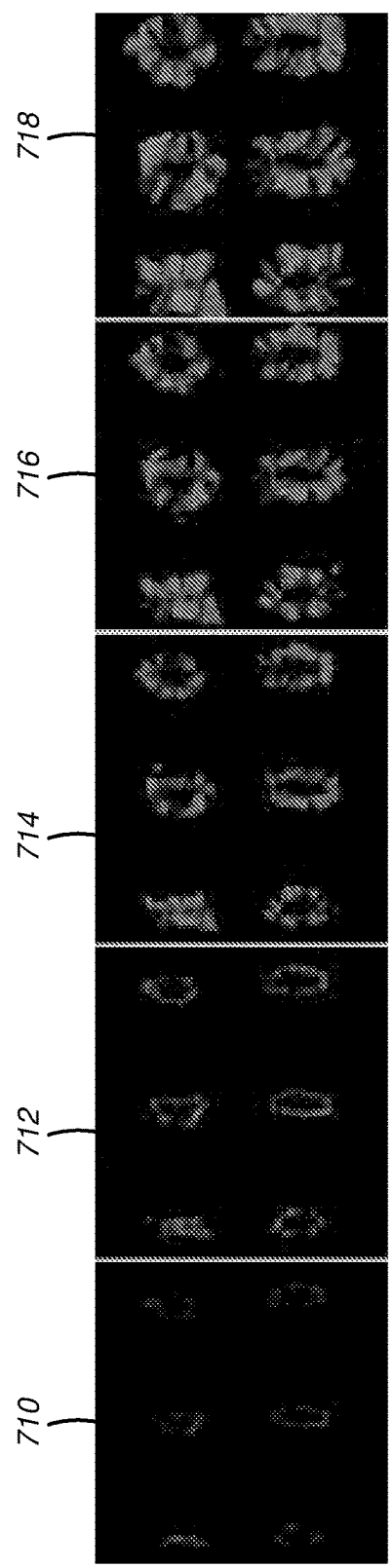
FIGS. 7B-7D are optical micrograph views that illustrate crystallization of a thin-film layer during an annealing process with height modifications formed in various patterns in the deposited thin-film layer according to embodiments of the present invention.
Figure 7C:
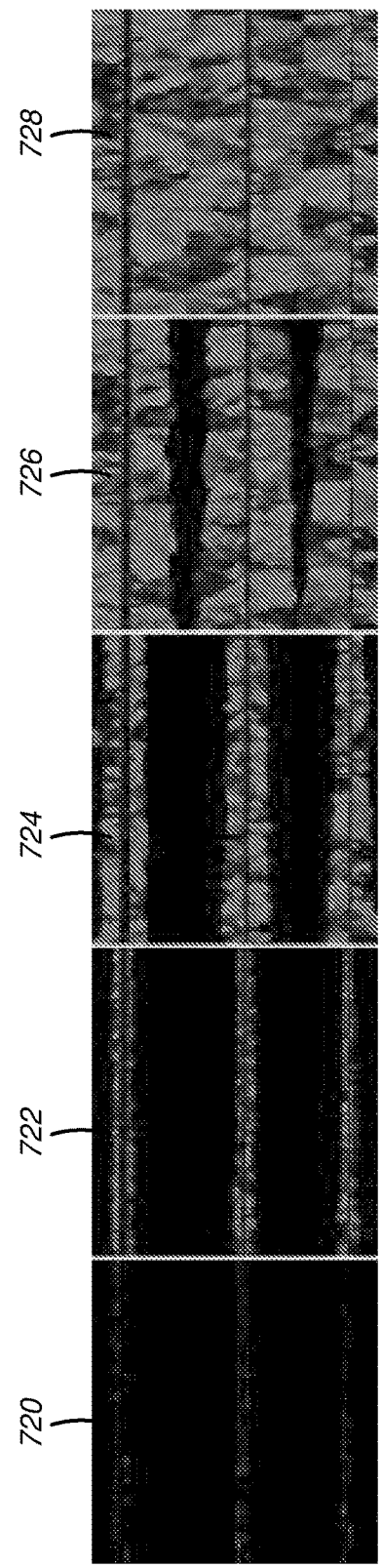
Figure 7D:
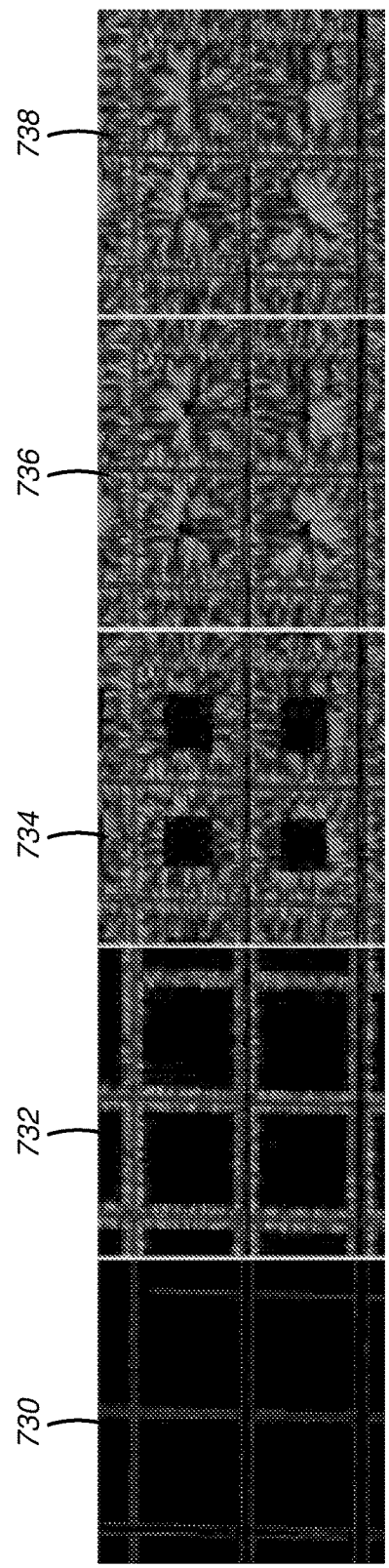

FIGS. 7A-7D are optical micrograph views that illustrate crystallization of thin-film layers at a plurality of different points in time, t1, t2, t3, t4, and t5. FIG. 7A illustrates a prior art method of crystallization, while FIGS. 7B-7D illustrate embodiments according to the present invention. It should be noted that for each embodiment, the actual lengths of time t1-t5 may vary, but were selected to compare the crystallization process in the different embodiments.

FIG. 7A illustrates a plurality of optical micrograph views 700, 702, 704, 706, and 708 of the crystallization of a thin-film layer during an annealing process without modification of the height of the deposited thin-film layer. View 700 is taken at a first instance of time $t_1$, view 702 is taken at time $t_2$ occurring after time $t_1$, and so on to view 708 taken at time $t_5$.

In particular, the embodiment shown in FIG. 7A illustrates that without modifying the thickness of amorphous thin-film layer to artificially induce nucleation, the crystallization process occurs randomly with no discernible pattern or control. This is in contrast with the embodiments shown in FIGS. 7B-7D, in which selective modification of the thickness of the amorphous thin-film layer allows crystallization to occur only where desired, allowing various patterns to be created and controlled with duration of the crystallization.

For example, the embodiment shown in FIG. 7B illustrates a dot array created by selectively stamping the amorphous thin-film layer (e.g., as shown in FIG. 4C) to create thicker areas around the region stamped. Once again, a plurality of optical micrograph views 710, 712, 714, 716, and 718 are illustrated, each corresponding to a subsequent step in time t1, t2, t3, t4, and t5, respectively. In contrast with the embodiment shown in FIG. 7A, the embodiment shown in FIG. 7B illustrates patterned crystallization of the amorphous thin-film at the areas corresponding to the thicker film region. At time t1, artificial nucleation is induced at the thicker regions of the amorphous thin-film, such that crystallization forms in these regions first. At time t2 as shown in magnified view 712, the initial areas of crystallization are utilized to seed surrounding areas, such that structured crystallization continues to grow from the thicker film regions. This pattern continues in the views shown in magnified views 714, 716, and 718, as crystallization continues to spread from the initial areas of crystallization to form an ordered dot array pattern.

The embodiment shown in FIG. 7C illustrates a pattern of parallel lines created by selectively scratching the amorphous thin-film layer (e.g., as shown in FIG. 4A or 4B) to create parallel regions wherein the amorphous thin-layer is thicker. Once again, a plurality of micrograph views 720, 722, 724, 726, and 728 are illustrated, each corresponding to a subsequent step in time t1, t2, t3, t4, and t5, respectively. In contrast with the embodiment shown in FIG. 7A, the embodiment shown in FIG. 7C illustrates patterned crystallization of the amorphous thin-film at the areas corresponding to the thicker film region. At time t1, artificial nucleation is induced at the thicker regions of the amorphous thin-film, such that crystallization forms in these regions first to form parallel lines of structured crystalline formation. At time t2 as shown in view 722, the initial parallel lines of crystallization are utilized to seed surrounding areas, such that structured crystallization continues to grow outward from the initial parallel lines. This pattern continues in views 724, 726, and 728, as crystallization continues to spread from the initial areas of crystallization to form an ordered pattern of parallel crystals.

The embodiment shown in FIG. 7D illustrates a grid-like pattern of parallel lines created by selectively scratching the amorphous thin-film layer (e.g., as shown in FIG. 4A or 4B, but including scratches in both directions) to create a grid of parallel scratches on the amorphous thin-layer. Once again, a plurality of micrograph views 730, 732, 734, 736, and 738 are illustrated, each corresponding to a subsequent step in time t1, t2, t3, t4, and t5, respectively. Once again, the embodiment shown in FIG. 7D illustrates patterned crystallization of the amorphous thin-film at the areas corresponding to the thicker film region. At time t1, artificial nucleation is induced at the thicker regions of the amorphous thin-film, such that crystallization forms in these regions first to form a grid-like array of lines in a structured crystalline formation. At time t2 as shown in view 732, the initial grid of crystallized lines are utilized to seed surrounding areas, such that structured crystallization continues to grow outward from the initial grid lines. This pattern continues in views 734, 736, and 738, as crystallization continues to spread from the initial areas of crystallization to form an ordered grid-like pattern of crystallization.

FIG. 8A is a polarized optical microscopy view of an ink-jet printed thin-film deposited according to known methods. As shown, the ink-jet printed thin-film dot deposited is circular in shape and printed at a size of approximately 200 micrometers (μm).

FIG. 8B is a polarized optical microscopy view of a thin-film layer stamped and annealed to form a crystal thin-film structure according to an embodiment of the present invention. As shown, the shape of the resulting crystal dot structure is also circular in shape, as desired, but is formed on a much smaller scale than the ink-jet printed thin-film (e.g., 100 μm in the embodiment shown). That is, a benefit of the present invention is the small size of the crystallized structures created by the fabrication process of the present invention as compared with ink-jet printed structures such as those shown in FIG. 8A.

FIG. 8C is a bright field optical microscopy view of a portion of the view shown in FIG. 8B that illustrates isolated islands within the dewetted structure of the thin-film according to an embodiment of the present invention. In particular, FIG. 8C illustrates that the crystallization process can be halted by removing the condition inducing the crystal growth. For example, removing the high temperature or solvent vapor can maintain the surrounding areas of thin film (e.g., the areas shown in FIG. 8C) in an amorphous state. As a result, the crystallized areas can be formed to remain isolated from one another, which is an important aspect for fabrication of electronic devices. In addition, the portion of the amorphous thin-film layer that is not crystallized is typically less stable thermally and/or chemically. As a result, the un-crystallized portions of the amorphous thin-film layer may be selectively degraded and removed. For example, in the case of TES ADT, exposing the thin film in air with UV-light will degrade the un-crystallized portions, thereby making these areas electronically insulating. In other embodiments, heating the un-crystallized thin-film to a temperature slightly lower than the melting point of the crystalline phase melts the un-crystallized portions, allowing the melted portions to dewet to leave isolated islands as shown in FIG. 8C. This embodiment creates fully isolated crystals, which are grown where desired, similar to what is obtained from ink-jet printing, but with smaller drop size and potentially higher performance and high throughput similar to conventional photolithographic methods.

Figure 9:
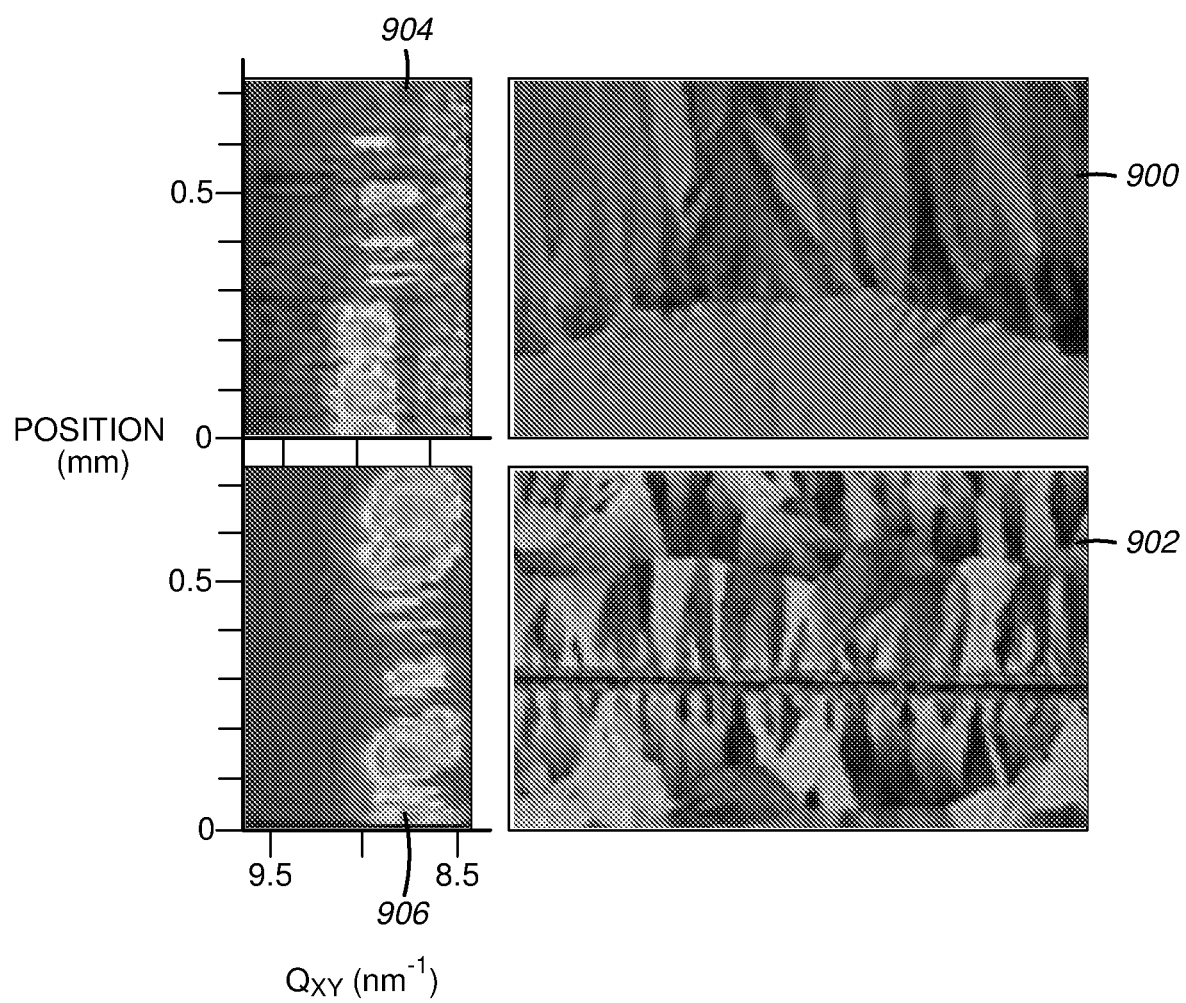
FIG. 9 is a micrograph illustrating $Q_{xy}$ positions of diffraction obtained from grazing-incident wide-angle x-ray diffraction at locations highlighted to the right of each micrograph, which are polarized optical microscopy views of a TES ADT thin film formed without artificially inducing nucleation (top) and with artificially induced nucleation by varying the thickness of the thin-film layer (bottom) via scratching of a longitudinal line.

FIG. 9 is a micrograph illustrating $Q_{xy}$ positions of diffraction obtained from grazing-incident wide-angle x-ray diffraction at locations highlighted to the right of each micrograph, which are polarized optical microscopy views of a TES ADT thin film formed without artificially inducing nucleation (top, 900) and with artificially induced nucleation by varying the thickness of the thin-film layer (bottom, 902) via scratching of a longitudinal line. The view shown at 900 indicates that without artificially inducing nucleation (i.e., leaving the thickness of the amorphous thin-film layer constant), spherulitic crystals are formed that display large variations in diffraction as indicated by $Q_{xy}$ axis 904. In turn, these variations in diffraction may result in decreased reproducibility in performance of electronic devices fabricated using this method. In contrast, the embodiment observed that utilized artificial nucleation via variations in the thickness of the thin-film layer—shown in view 902—provides structured crystal grown having a relatively constant lattice parameter throughout the film, which may be due to the limited length of the crystal growth. As a result, diffraction indicated by $Q_{xy}$ axis 904 is much more consistent across the structured crystal.

Figure 10:
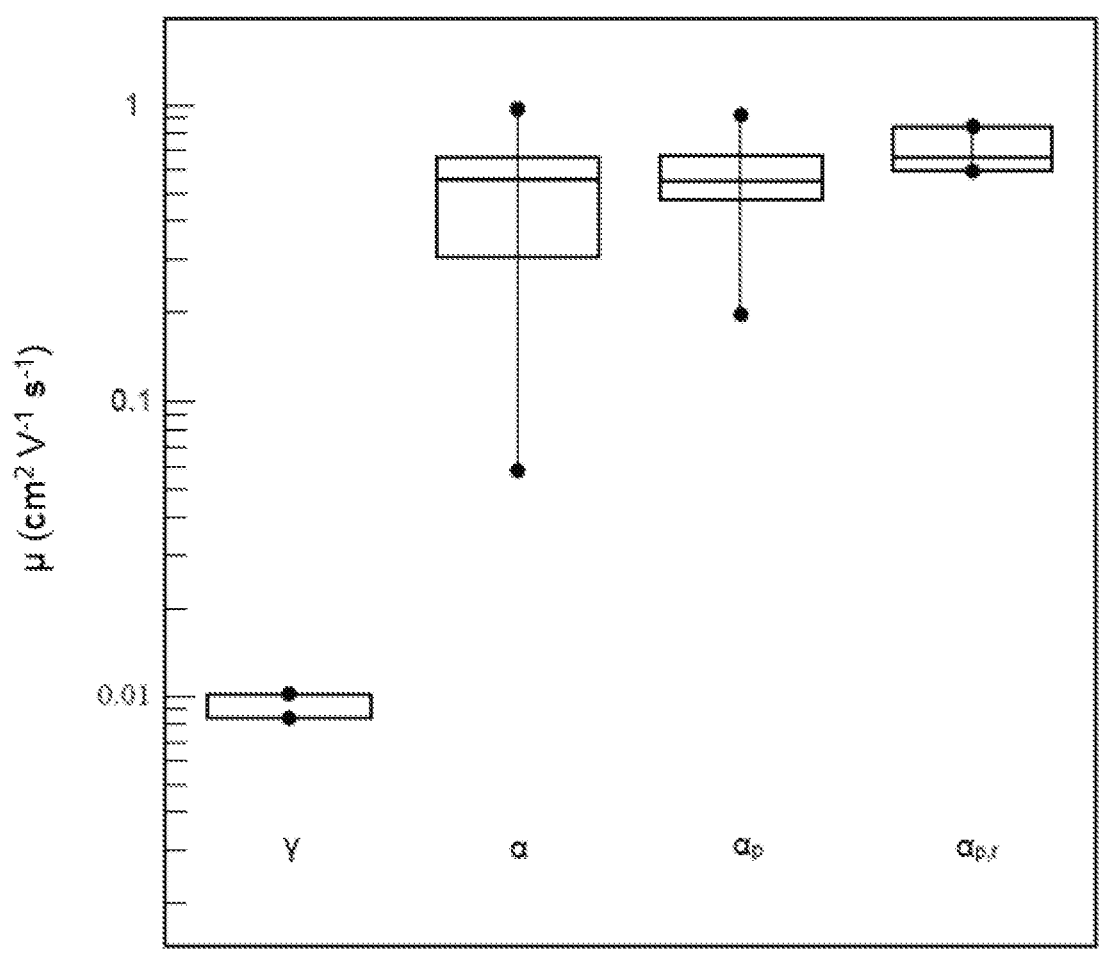
FIG. 10 is a chart illustrating carrier mobility (μ) and its spread associated with an organic field effect transistors (OFET) fabricated via traditional methods as compared with methods of the present invention utilizing artificial nucleation.

FIG. 10 is a chart illustrating carrier mobility (μ) associated with an organic field effect transistors (OFET) fabricated via traditional methods as compared with methods of the present invention utilizing artificial nucleation. In the embodiment shown in FIG. 10, data is provided with respect to an amorphous thin-films without crystallization (γ-phase), an amorphous thin-film crystallized via a solvent vapor (α-phase), a crystallized patterned thin-film according to the present invention ($α_p$-phase), and a crystallized patterned thin-film with a device registered at least 150 μm away from the nuclei ($α_{p,r}$-phase). Carrier mobility for each of the various embodiments is presented in the chart, wherein the dots represent maximum and minimum values, the box portion represents the value from 25% to 75% of the maximum and minimum values observed, and the middle line represents the average value observed. For example, for amorphous thin-films that have been crystallized (α-phase, second from the left), the maximum carrier mobility value is 1 $cm^2V^{-1}s^{-1}$, while the minimum carrier mobility value is approximately 0.06 $cm^2V^{-1}s^{-1}$.

As expected, crystallizing the amorphous thin-film via a solvent vapor annealing process significantly increases the charge mobility (μ) of the thin-film structure as indicated by the difference in mobility between γ-phase and the α-phase.

However, as compared with the α-phase, in which no artificial nucleation is induced, the $α_p$-phase and $α_{p,r}$-phase provide improved carrier mobility μ in the OFET device. In particular, while the maximum carrier mobility is approximately unchanged between the α-phase, the $α_p$-phase and $α_{p,r}$-phase, the minimum carrier mobility is significantly improved in both the $α_p$-phase and $α_{p,r}$-phase (i.e., structured crystalline structures). That is, by artificially inducing nucleation, the spread of performance is reduced to a very small range on the top end of the scale, thereby providing improved performance over amorphous thin-films with no artificial nucleation. In addition, the average carrier mobility in the embodiments utilizing artificial nucleation is improved over the embodiments that do not employ artificial nucleation.

The present invention therefore provides a method of fabricating patterned crystal structures. This may include patterned crystal thin-film structures or patterned crystal three-dimensional structures. With respect to thin-films, the present invention structures the formation of crystal structures by selectively modifying the thickness of the amorphous thin-film layer. The resulting patterned crystalline thin-film structure provides improved characteristics over traditional un-patterned thin-film structures. For example, in semiconductor type applications, carrier mobility and its reproducibility are improved, which is an important characteristic for defining performance of organic semiconductor devices such as organic field-effect transistors (OFETs) and similar devices. Although semiconductors is one industry in which the present invention may be applicable, in number of additional industries may make use of this technique of creating patterned crystal structures, whether the material is organic, inorganic, or other.

Similarly, while thin-film structures have been discussed due to the ability to easily modify the thickness of various portions of the thin-film relative to one another, and therefore create desired patterns, the method are similarly applicable to three-dimensional structures, in which volume differences between portions of the three-dimensional structure determine nucleation time and therefore the patterned crystallization of the structure.

While the invention has been described with reference to an exemplary embodiment(s), it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment(s) disclosed, but that the invention will include all embodiments falling within the scope of the appended claims.

The invention claimed is:

1. A method of manufacturing a patterned, crystal thin-film material, the method comprising:
depositing an amorphous thin-film layer onto a substrate;
modifying the amorphous thin-film layer such that a first portion of the amorphous thin-film layer has a first thickness and a second portion of the amorphous thin-film layer has a second thickness greater than the first thickness;
annealing the amorphous thin-film layer to induce crystallization of the thin-film layer, wherein crystallization is induced in the second portion first due to the greater thickness of the second portion relative to the first portion to form patterned crystalline structures in the thin-film material; and
removing portions of the amorphous thin-film structure that have not been crystallized.

2. The manufacturing method of claim 1, wherein the amorphous thin-film structure is a kinetically quenched solid state structure.

3. The manufacturing method of claim 1, wherein modifying the amorphous thin-film structure includes utilizing a deposition process in which an initial layer of amorphous thin-film structure is deposited onto the substrate and a subsequent layer of amorphous thin-film structure is deposited over select portions of the initial layer of amorphous thin-film structure.

4. The manufacturing method of claim 3, wherein the deposition of the amorphous thin-film structure utilizes a vapor based deposition process or a printing process.

5. The manufacturing method of claim 1, wherein modifying the amorphous thin-film structure includes mechanically modifying the amorphous thin-film structure.

6. The manufacturing method of claim 5, wherein mechanically modifying the amorphous thin-film structure includes scratching a surface of the amorphous thin-film layer to push material located at the point of contact to an area adjacent to the point of contact.

7. The manufacturing method of claim 5, wherein mechanically modifying the amorphous thin-film structure includes stamping a surface of the amorphous thin-film layer to push material located at the point of contact to an area adjacent to the point of contact.

8. The manufacturing method of claim 5, wherein mechanically modifying the amorphous thin-film structure includes creating patterns within a surface of the amorphous thin-film structure.

9. The manufacturing method of claim 1, wherein crystallization induced in the second portion acts as seeding for crystallization in the first portion.

10. The manufacturing method of claim 1, wherein removing portions of the amorphous thin-film structure includes exposing the thin film to UV light to degrade non-crystallized amorphous thin-film structures from the substrate.

11. The manufacturing method of claim 1, wherein removing portions of the amorphous thin-film structure includes applying a solvent to degrade and/or dissolve the non-crystallized amorphous thin-film structures from the substrate.

12. The manufacturing method of claim 1, wherein removing portions of the amorphous thin-film structure includes exposing the thin film to a chemical to degrade non-crystallized amorphous thin-film structures from the substrate.

13. The manufacturing method of claim 12, wherein the chemical is ozone.

14. The manufacturing method of claim 1, wherein removing portions of the amorphous thin-film structure includes heating the thin-film structure to a temperature slightly lower than a melting point of the crystalline phase to melt the non-crystallized amorphous thin-film structures.

15. A method of manufacturing a patterned, crystal three-dimensional material, the method comprising:
depositing an amorphous material, wherein at least a first portion of the deposited amorphous material has a first volume and a second portion of the deposited amorphous material has a second volume that is greater than the first volume;
annealing the amorphous material to induce crystallization, wherein crystallization is induced in the second portion first due to the greater volume of the second portion relative to the first portion to form patterned crystalline structures in the thin-film material, wherein the first portion of the deposited material has a first thickness and the second portion of the deposited amorphous material has a second thickness that is greater than the first thickness; and
removing portions of the amorphous three-dimensional structure that have not been crystallized.

16. The manufacturing method of claim 15, wherein crystallization induced in the second portion acts as seeding for crystallization in the first portion.

* * * * *